(12) United States Patent
Yoon (10) Patent No.: US 11,445,634 B2
(45) Date of Patent: Sep. 13, 2022

(54) WATER PUMP FOR WATER COOLER FOR ELECTRONIC COMPONENT

(71) Applicant: Zalman Tech Co., Ltd., Anyang-si (KR)

(72) Inventor: Kukyoung Yoon, Anyang-si (KR)

(73) Assignee: ZALMAN TECH CO., LTD., Anyang-si (KR)

( * ) Notice: Subject to any disclaimer, the term of this patent is extended or adjusted under 35 U.S.C. 154(b) by 324 days.

(21) Appl. No.: 16/757,813

(22) PCT Filed: Jun. 20, 2018

(86) PCT No.: PCT/KR2018/006972
§ 371 (c)(1),
(2) Date: Apr. 21, 2020

(87) PCT Pub. No.: WO2019/103265
PCT Pub. Date: May 31, 2019

(65) Prior Publication Data
US 2021/0360823 A1    Nov. 18, 2021

(30) Foreign Application Priority Data
Nov. 21, 2017   (KR) ........................ 10-2017-0155399

(51) Int. Cl.
*H05K 7/20* (2006.01)
*F04D 13/06* (2006.01)
(Continued)

(52) U.S. Cl.
CPC ......... *H05K 7/20272* (2013.01); *F04D 13/06* (2013.01); *F04D 15/0066* (2013.01);
(Continued)

(58) Field of Classification Search
CPC ...... F04D 13/06; F04D 15/0066; F04D 29/18; F04D 29/406; F04D 29/586;
(Continued)

(56) References Cited

U.S. PATENT DOCUMENTS 8,746,326 B2 *  6/2014  Mou ..................... H01L 23/473
                                                         165/80.4
10,198,046 B2 * 2/2019  Tsai .................... H05K 7/20272
(Continued)

*Primary Examiner* — Richard A Edgar
*Assistant Examiner* — Jason G Davis
(74) *Attorney, Agent, or Firm* — NSIP Law (57) ABSTRACT

A pushing action and a suction action are simultaneously performed on a working fluid passing through a heat transfer base, such that a heat exchange of cooling water can be efficiently performed, according to one embodiment of the present invention. To this end, a water pump for a water cooler for an electronic component, according to one embodiment of the present invention, comprises: a heat transfer base which is positioned at a lower portion and has an upper surface provided with a plurality of channels through which cooling water flows so as to exchange heat with the flowing cooling water; a base cover which is positioned at an upper portion of the heat transfer base so as to cover the top portions of the plurality of channels and has a first through hole and a second through hole vertically penetrating therethrough formed with a predetermined space from each other, wherein a first shaft fixing portion and a second shaft fixing portion are formed in the centers of the first and second through holes, respectively; an inlet impeller which rotates around a first shaft vertically installed on the first shaft fixing portion and pushes the cooling water to the upper surface of the heat transfer base; a discharge impeller which rotates about a second shaft vertically installed on the second shaft fixing portion and sucks the cooling water from the upper surface of the heat transfer base; a chamber portion, positioned at an upper portion of
(Continued)

the heat transfer base, which has an inlet chamber and discharge chamber and has an inlet port communicating with the inlet chamber and a discharge port communicating with the discharge chamber formed on one side thereof, wherein the inlet chamber and the discharge chamber accommodate the inlet impeller and the discharge impeller thereinside, respectively; and a driving part including a first motor stator positioned above the inlet chamber and a second motor stator positioned above the discharge chamber.

6 Claims, 6 Drawing Sheets

(51) Int. Cl.
  F04D 15/00 (2006.01)
  F04D 29/18 (2006.01)
  F04D 29/40 (2006.01)

(52) U.S. Cl.
  CPC ............ *F04D 29/18* (2013.01); *F04D 29/406* (2013.01); *H05K 7/20263* (2013.01); *H05K 7/20281* (2013.01)

(58) Field of Classification Search
  CPC ............ F04D 29/5866; F04D 29/5873; H05K 7/20218; H05K 7/20263; H05K 7/20272; H05K 7/20281
  See application file for complete search history.

(56) References Cited

U.S. PATENT DOCUMENTS

| | | | |
|---|---|---|---|
| 10,883,518 B2 * | 1/2021 | Sheng | ................. F04D 29/5873 |
| 2009/0159244 A1 * | 6/2009 | Mounioloux | ............. G06F 1/20 165/104.33 |

* cited by examiner

WATER PUMP FOR WATER COOLER FOR ELECTRONIC COMPONENT

CROSS REFERENCE TO RELATED APPLICATIONS

This application is a U.S. National Stage Application of International Application No. PCT/KR2018/006972 filed on Jun. 20, 2018, which claims the benefit under 35 USC 119(a) and 365(b) of Korean Patent Application No. 10-2017-0155399 filed on Nov. 21, 2017, in the Korean Intellectual Property Office, the entire disclosure of which is incorporated herein by reference for all purposes.

TECHNICAL FIELD

The present disclosure relates to a water pump and more particularly, to a water pump of a water-cooling cooler for an electronic component, used in cooling of the electronic component.

BACKGROUND ART

A water pump of a water-cooling cooler for an electronic component of the related art uses a method of pushing working fluid using a single impeller located between a chamber and a water block (or a thermal exchange base). However, since the working fluid should re-enter the chamber through the water block and circulate through a condenser consisting of a radiator and a fan through a tube, there is a drawback in that this method is not efficient compared to general circulation of fluid.

Some of water pumps of a water-cooling cooler for an electronic component of the related art are configured such that a thermal exchange chamber of a water block is separated from a pump chamber and forms a passage through which working fluid flows, as in the U.S. Pat. No. 8,245,764 B2. In response to working fluid being congested by a turbulence flow, a change in the cross-sectional area of the water block, or the like, such a water-cooling cooler for an electronic component of the related art may have low thermal exchange efficiency and, in a number of cases, a motor may be overloaded.

Accordingly, requirements for the study of a novel water pump of a water-cooling cooler for an electronic component, wherein the water pump can overcome the problems of the low thermal exchange efficiency and the motor overload of the related art, have come into prominence.

DISCLOSURE

Technical Problem

The present disclosure has been made in consideration of the above-described problems occurring in the related art, and a first objective of the present disclosure is to provide a water pump of a water-cooling cooler for an electronic component, the water pump having a structure in which a push action and a suction action may be simultaneously performed on working fluid flowing through a thermal exchange base so as to enable efficient heat exchange.

A second objective of the present disclosure is to provide a water pump of a water-cooling cooler for an electronic component, in which a chamber structure may be divided into an inlet chamber receiving working fluid enters and an outlet chamber discharging working fluid and impellers are disposed in the inlet chamber and the outlet chamber, respectively, such that the push action and the suction action may be simultaneously performed on working fluid passing through the thermal exchange base to minimize a turbulence flow, thereby improving the heat transfer efficiency of working fluid.

A third objective of the present disclosure is to provide a water pump of a water-cooling cooler for an electronic component, in which an inlet chamber or an outlet chamber may be directly provided on the upper portion of the thermal exchange base and an inlet impeller and an outlet impeller may directly perform the push action and the suction action in the upper portions of channels of the thermal exchange base in order to increase the velocity of working fluid in an inlet port and an outlet port provided in portions of the inlet and outlet chambers and to minimize residual fluid on the thermal exchange base.

A fourth objective of the present disclosure is to provide a water pump of a water-cooling cooler for an electronic component, in which a base cover may be provided on the thermal exchange base such that the inlet chamber and the outlet chamber are isolated so that no paths other than the channels on the thermal exchange base are formed, thereby preventing flows of working fluid having different levels of thermal energy from mixing and improving thermal exchange efficiency in the channels.

Technical Solution

The above-described objectives of the present disclosure may be realized by providing a water pump of a water-cooling cooler for an electronic component. The water pump may include: a thermal exchange base located in a lower portion of the water pump, wherein a plurality of channels are provided on a top surface of the thermal exchange base such that cooling water flows through the plurality of channels to perform thermal exchange; a base cover located above the thermal exchange base to transversely block upper portions of the plurality of channels, wherein a first through-hole and a second through-hole vertically extend through the base cover to be spaced apart from each other at a predetermined distance and a first shaft-fixing portion and a second shaft-fixing portion are provided in central portions of the first through-hole and the second through-hole, respectively; an inlet impeller being rotatable about the first shaft vertically provided in the first shaft-fixing portion to push the cooling water to the top surface of the thermal exchange base; an outlet impeller being rotatable about the second shaft vertically provided in the second shaft-fixing portion to draw the cooling water from the top surface of the thermal exchange base; a chamber located above the thermal exchange base and including an inlet chamber that the cooling water enters, an outlet chamber that the cooling water exits, an inlet port communicating with the inlet chamber, and an outlet port communicating with the outlet chamber, such that the inlet impeller and the outlet impeller are accommodated in the inlet chamber and the outlet chamber, respectively; and a drive unit including a first motor stator located above the inlet chamber and a second motor stator located above the outlet chamber.

The base cover may include supports provided on inner circumferential portions of the first and second through-holes and connected to the first and second shaft-fixing portions, respectively.

The chamber may be configured such that a portion between the inlet chamber and the outlet chamber adjoins the top surface of the base cover and the inlet chamber and the outlet chamber are isolated from each other, in positions above the plurality of channels.

In addition, the chamber may include a horizontal connector provided by horizontally expanding the inlet chamber and the outlet chamber, the horizontal connector being coupled to the thermal exchange base in a top-bottom direction in a sealing manner.

The water pump may further include a pump housing covering top portions of the chamber to accommodate the first and second motor stators therein.

The water pump may further include a controller electrically connected to the drive unit to control speeds of rotation of the inlet impeller and the outlet impeller.

Advantageous Effects

According to an embodiment of the present disclosure, a push action and a suction action may be simultaneously performed on working fluid flowing through a thermal exchange base so as to enable efficient heat exchange.

In addition, the chamber structure may be divided into the inlet chamber receiving working fluid enters and the outlet chamber discharging working fluid and impellers are disposed in the inlet chamber and the outlet chamber, respectively, such that the push action and the suction action may be simultaneously performed on working fluid passing through the thermal exchange base to minimize a turbulence flow, thereby improving the heat transfer efficiency of working fluid.

In addition, the inlet chamber or the outlet chamber may be directly provided on the upper portion of the thermal exchange base and the inlet impeller and the outlet impeller may directly perform the push action and the suction action in the upper portions of the channels of the thermal exchange base in order to increase the velocity of working fluid in the inlet port and the outlet port provided in portions of the inlet and outlet chambers and to minimize residual fluid on the thermal exchange base.

In addition, the base cover may be provided on the thermal exchange base such that the inlet chamber and the outlet chamber are isolated so that no paths other than the channels on the thermal exchange base are formed, thereby preventing flows of working fluid having different levels of thermal energy from mixing and improving thermal exchange efficiency in the channels.

MODES OF THE INVENTION

Hereinafter, embodiments of the present disclosure will be described in detail with reference to the accompanying drawings, but the present disclosure is not limited or restricted by the embodiments.

Embodiments to be described hereinafter may be modified variously. However, it is not intended to limit the embodiments to be described hereinafter to such specific forms, but it should be understood that the embodiments include all modifications, equivalents, and substitutions thereof.

The terminologies as used in the embodiments are intended to illustrate but not limit specific embodiments. Singular forms are intended to mean plural forms unless the context clearly indicates otherwise. It should be further understood that the terminologies "comprise", "include", "have", etc., when used herein, specify the presence of stated features, integers, steps, operations, elements, components, and/or combinations thereof but do not preclude the presence or addition of one or more other features, integers, steps, operations, elements, components, and/or combinations thereof.

In addition, in the description of the present disclosure, a detailed description of known functions and configurations will be omitted in the situation in which the subject matter of the present disclosure may be rendered unclear thereby. The terminologies used herein are defined to properly illustrate the embodiments of the present disclosure but may vary depending on the intentions of users or operators, as well as practices of the field to which the present disclosure belongs. Therefore, the terminologies shall be defined on the basis of the description throughout the specification.

In description with reference to the accompanying drawings, the same elements will be designated by the same reference numerals although they are shown in different drawings and repetitive descriptions thereof will be omitted. Further, in description of embodiments, detailed descriptions of known technical features will be omitted in the situation in which the subject matter of the present disclosure may be rendered unclear thereby.

Water Pump of Water-Cooling Cooler for Electronic Component

FIGS. 1 to 5 are perspective, plan, front, bottom and cross-sectional views illustrating a water pump of a water-cooling cooler for an electronic component according to an embodiment of the present disclosure. When cold cooling water (or working fluid) enters an inlet tube 72, the water pump 1 according to the embodiment of the present disclosure serves to receive heat transferred through a chamber 50 and a thermal exchange base 10 and discharge heat through an outlet tube 74.

Hereinafter, an embodiment of the present disclosure will be described in detail with reference to FIGS. 1 to 5. As illustrated in FIGS. 1 to 4, the water pump according to the present embodiment has an overall cylindrical outer shape in which a pump housing 70, the chamber 50, and the thermal exchange base 10 are connected in a top-bottom direction. The thermal exchange base 10 may be fabricated from a metal material, such as copper (Cu), having high thermal exchange efficiency, as well as of a synthetic resin material by injection molding, in order to facilitate the fabrication.

Figure 1:
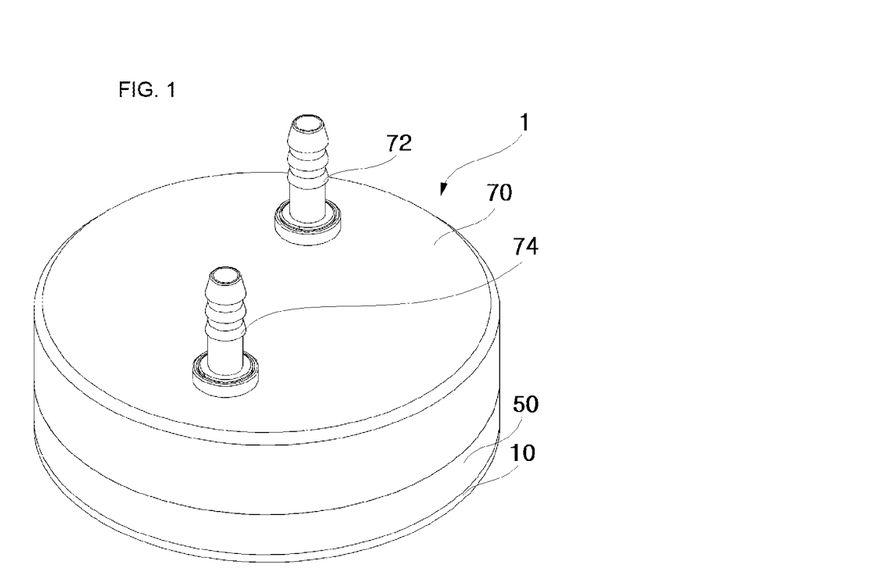
FIG. 1 is a perspective view illustrating a water pump of a water-cooling cooler for an electronic component according to an embodiment of the present disclosure.
Figure 2:
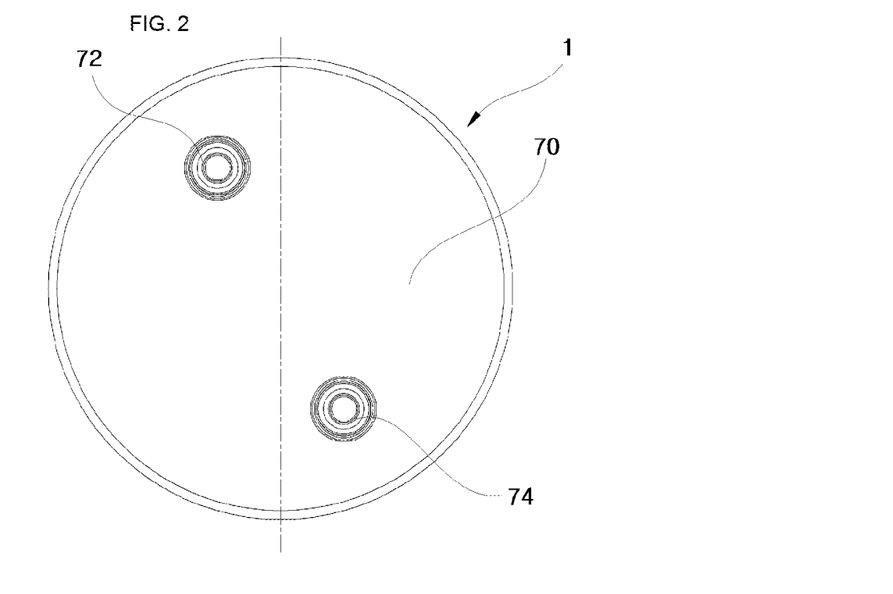
FIG. 2 is a plan view illustrating the water pump of a water-cooling cooler for an electronic component according to the embodiment of the present disclosure.
Figure 3:
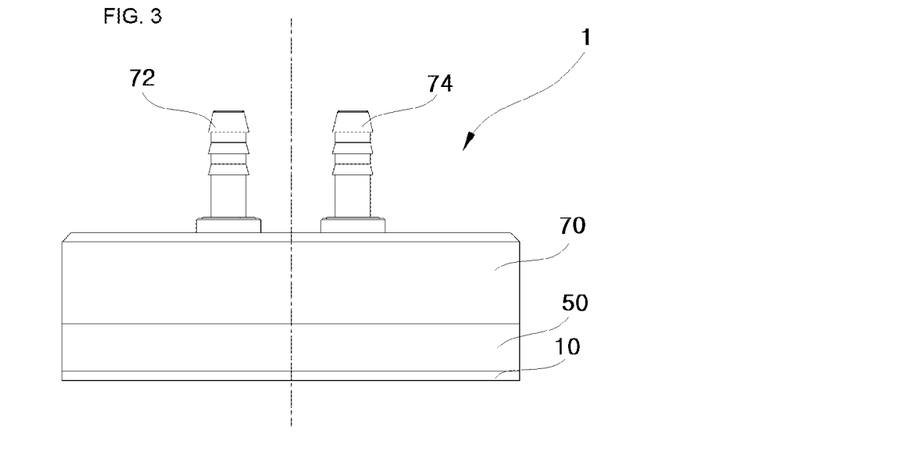
FIG. 3 is a front view illustrating the water pump of a water-cooling cooler for an electronic component according to the embodiment of the present disclosure.
Figure 4:
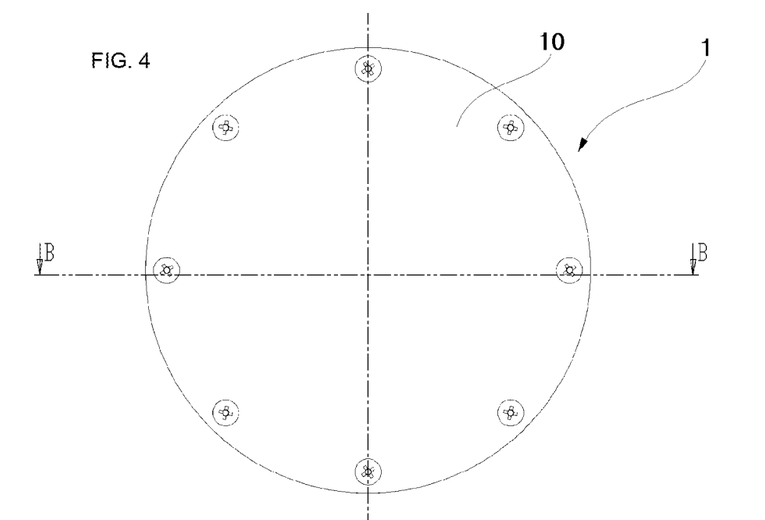
FIG. 4 is a bottom view illustrating the water pump of a water-cooling cooler for an electronic component according to the embodiment of the present disclosure.
Figure 5:
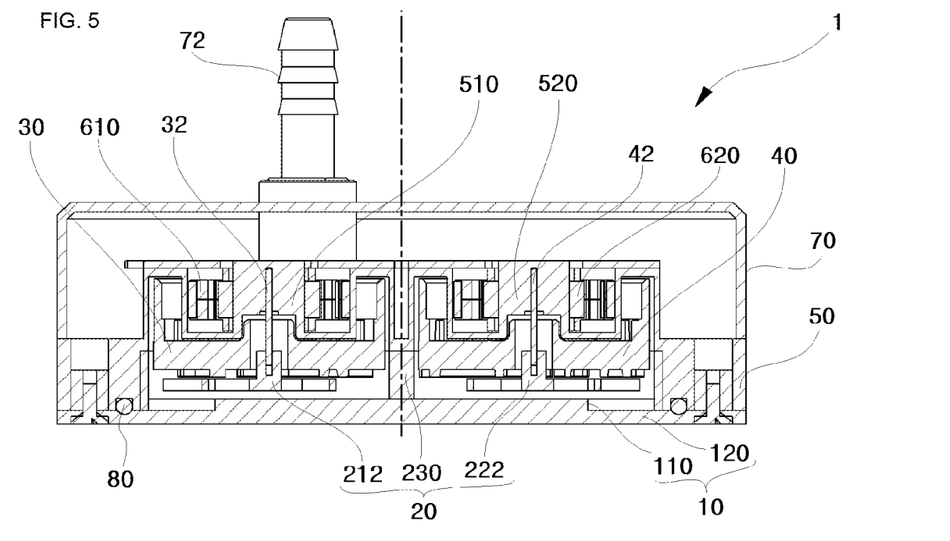
FIG. 5 is a cross-sectional view taken along a direction BB in FIG. 4.

In particular, as illustrated in the cross-sectional view of FIG. 5, the water pump 1 according to the present embodiment includes the thermal exchange base 10 located in the lower portion and comprised of channels 110 and a copper base 120, a base cover 20 located above the thermal exchange base 10, an inlet impeller 30 and an outlet impeller 40 located in a first through-hole 210 and a second through-hole 220 of the base cover 20, respectively, the chamber 50 accommodating the inlet impeller 30 and the outlet impeller 40, and a driver driving the inlet impeller 30 and the outlet impeller 40.

The thermal exchange base 10 is configured to transfer heat to incoming cold cooling water. As illustrated in FIG. 5, the copper base 120 is located on the bottom and has bolt holes formed in the edge thereof to be bolt-connected to the chamber 50 located thereabove. A plurality of channels 110 are provided on the top surface of the copper base 120. The plurality of channels 110 form flow paths for fluid, i.e. cooling water, in a lateral direction, and are comprised of a plurality of long fins arranged at predetermined distances from each other.

The base cover 20 is located above the thermal exchange base 10 to primarily transversely block the upper portions of the plurality of channels 110 in the central portion 230. Thus, due to the central portion 230, the left inlet chamber 510 and the right outlet chamber 520 are isolated from each other, except for the flow paths of the channels 110. Here, the inlet chamber 510 and the outlet chamber 520 may be understood as a concept including chamber spaces that cooling water enters and exits. In this case, a portion of the chamber space is defined to accommodate the inlet impeller 30 and the outlet impeller 40, as seen from the cross-sectional view of FIG. 5.

The base cover 20 has the first through-hole 210 and the second through-hole 220 vertically extending through the base cover 20 such that the first through-hole 210 and the second through-hole 220 are spaced apart from each other at a predetermined distance. A first shaft-fixing portion 212 and a second shaft-fixing portion 222 are provided on the central portions of the first through-hole 210 and the second through-hole 220, respectively. In addition, the edge of the base cover 20 may be in contact with and fitted into the side surface of the lower portion of the chamber 50 so as to be accommodated in the chamber 50. This will be described later with reference to the exploded perspective view of FIG. 7 and the bottom perspective views of FIGS. 8 and 9.

In the present embodiment, in relation to the circulation of cooling water, the inlet impeller 30 and the outlet impeller 40 are provided. As illustrated in FIG. 5, the inlet impeller 30 rotates about a first shaft 32 vertically mounted on the first shaft-fixing portion 212 to push cooling water to the top surface of the thermal exchange base 10, while the outlet impeller 40 rotates about a second shaft 42 mounted vertically on the second shaft-fixing portion 222 to draw cooling water from the top surface of the thermal exchange base 10.

The inlet impeller 30 and the outlet impeller 40 are accommodated within the inlet chamber 510 and the outlet chamber 520, respectively. An inlet port 512 through which cooling water enters is provided on one side portion of the inlet chamber 510, and an outlet port 522 through which cooling water exits is provided on one side portion of the outlet chamber 520.

The upper structure defines the inlet chamber 510 as a chamber space. In particular, convex and concave portions of the upper structure are radially repeated in the upper central portion of the inlet chamber 510 to transfer power between the inlet impeller 30 inside of the chamber space and the motor stator 610 outside of the chamber space.

That is, the upper structure is configured to be convex portion such that the top end of the first shaft 32 is mounted on the central portion within the chamber space, be concave such that the motor stator 610 is disposed around the central portion outside of the chamber space, and be convex again such that the rotor of the inlet impeller 30 is disposed around the motor stator 610 within the chamber space.

The upper structure of the inlet chamber 510 is applied in the same manner to the upper structure of the outlet chamber 520, and descriptions of the outlet chamber 520 will be omitted.

In addition, the chamber 50 has a horizontal connector provided on the edge thereof and expanding in the horizontal direction to be vertically connected to the thermal exchange base 10. The horizontal connector may be configured such that holes are formed in the horizontal connector, sleeves 90 are fitted into the holes, and a plurality of bolts 92 are coupled to the sleeves 90 from below. In addition, since the chamber 50 contains cooling water in the chamber space, an O-ring 80 for providing a watertight structure may be disposed on a side structure of the horizontal connector provided for mutual coupling.

The first motor stator 610 and the second motor stator 620 are components of the drive unit for operating the inlet impeller 30 and the outlet impeller 40 are disposed on the top portion of the inlet chamber 510 and the top portion of the outlet chamber 520, respectively. The positional relationship of the stator and the rotor are the same as described above. It is preferable that the stator and the rotor are disposed adjacent to each other in the horizontal direction in order to minimize an energy loss in the transmission of power between the stator and the rotor.

Figure 6:
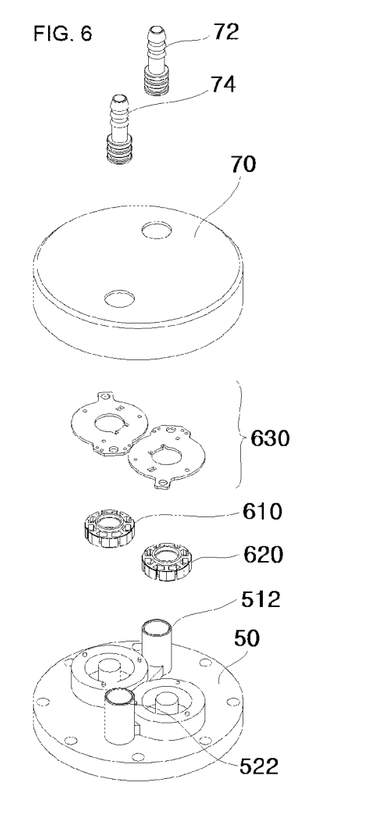
FIG. 6 is an exploded perspective view illustrating components of the upper chamber of the water pump of a water-cooling cooler according to the embodiment of the present disclosure.

FIG. 6 is an exploded perspective view illustrating components of the upper chamber of the water pump of a water-cooling cooler according to the embodiment of the present disclosure. As illustrated in FIG. 6, the pump housing 70 is disposed in the upper portion of the water pump 1 to accommodate the first and second motor stators 610 and 620 and a circuit board 630. In addition, the inlet port 512 and the outlet port 522 of the chamber 50 protrude through a pair of holes formed in one surface of the pump housing 70, and the inlet tube 72 and the outlet tube 74 are mounted on the inlet port 512 and the outlet port 522.

Figure 7:
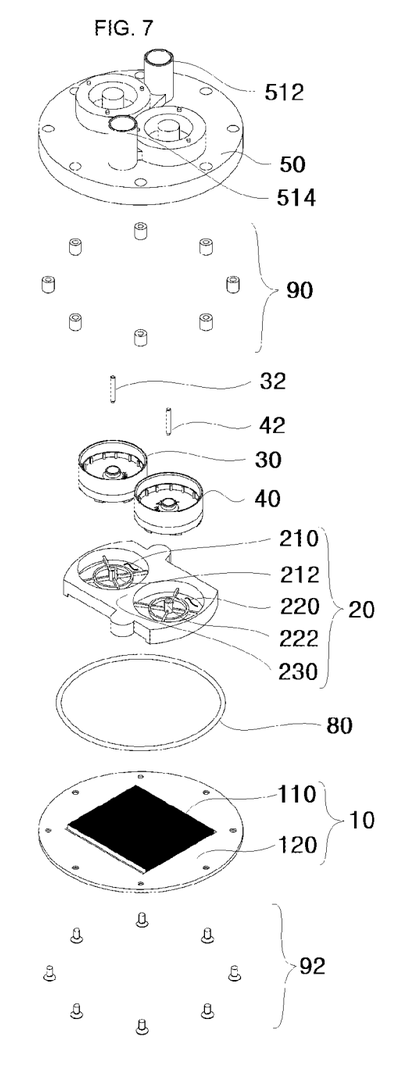
FIG. 7 is an exploded perspective view illustrating components of the lower chamber of the water pump of a water-cooling cooler for an electronic component according to the embodiment of the present disclosure.

FIG. 7 is an exploded perspective view illustrating components of the lower chamber of the water pump of a water-cooling cooler for an electronic component according to the embodiment of the present disclosure. As illustrated in FIG. 7, the upper structure of the chamber structure is the same as described above, the horizontal connector is an edge structure for connecting the chamber 50 and the thermal exchange base 10 below the chamber 50. The horizontal connector is provided with a plurality of coupling holes, such that the sleeves are fitted to the inner circumferential portions thereof. The bolts 92 are coupled to the sleeves 90 through the holes formed in the edge of the copper base 120.

The inlet impeller 30 and the outlet impeller 40 accommodated in the chamber 50 are fixed to the first and second shafts 32 and 42, and the bottom ends of the first and second shafts 32 and 42 are fixed to the first and second shaft-fixing portions 212 and 222 of the base cover 20, respectively.

As illustrated in FIG. 7, the base cover 20 has the first through-hole 210 and the second through-hole 220 extending directly downwardly with respect to the inlet impeller 30 and the outlet impeller 40, respectively. In addition, connecting portions extend from the inner circumferential portions of the first and second through-holes 210 and 220, such that the first and second shaft-fixing portions 212 and 222 located at the center of the first and second through-holes 210 and 220 may remain in the positions thereof.

In addition, as described above, the central portion 230 of the base cover 20 may adjoin the top surface of the channel 110 located therebelow, thereby transversely blocking the top portion of the channel 110 in the central portion of the channel 110. For this, the central portion 230 of the base cover 20 may be provided with a predetermined thickness between the inlet chamber 510 and the outlet chamber 520 so as to isolate the inlet chamber 510 and the outlet chamber 520 from each other.

Figure 8:
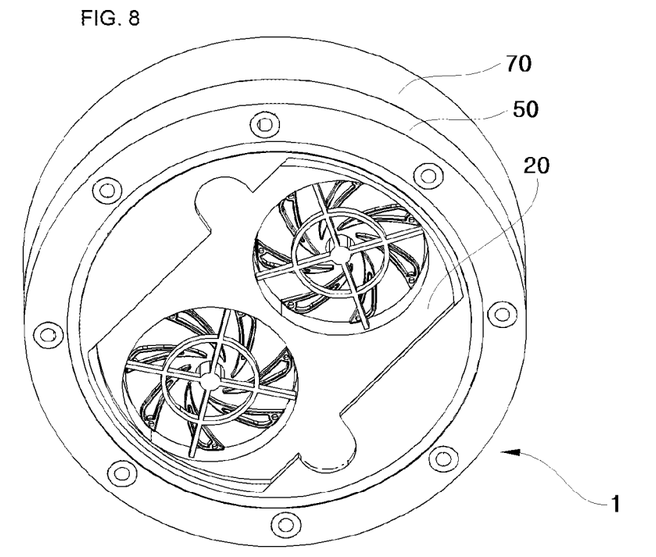
FIG. 8 is a bottom perspective view illustrating the water pump of a water-cooling cooler for an electronic component according to the embodiment of the present disclosure, from which the thermal exchange base is omitted.
Figure 9:
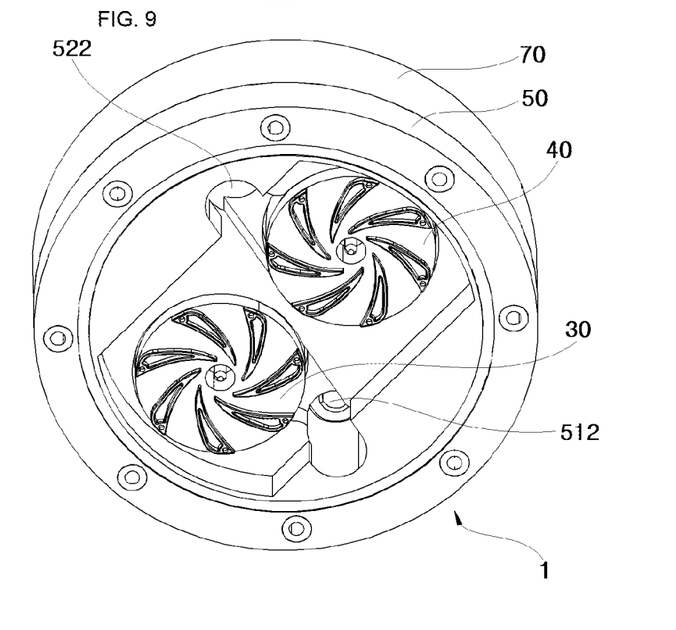
FIG. 9 is a bottom perspective view illustrating the water pump of a water-cooling cooler for an electronic component according to the embodiment of the present disclosure, from which the thermal exchange base and the base cover are omitted.

FIG. 8 is a bottom perspective view illustrating the water pump of a water-cooling cooler for an electronic component according to the embodiment of the present disclosure, from which the thermal exchange base is omitted, and FIG. 9 is a bottom perspective view illustrating the water pump of a water-cooling cooler for an electronic component according to the embodiment of the present disclosure, from which the thermal exchange base and the base cover are omitted. As illustrated in FIGS. 8 and 9, it may be understood that the water pump 1 according to the present embodiment includes the spaces of the first through-hole 210 and the second through-hole 220 to expand the chamber spaces of the inlet chamber 510 and the outlet chamber 520, respectively.

Figure 10:
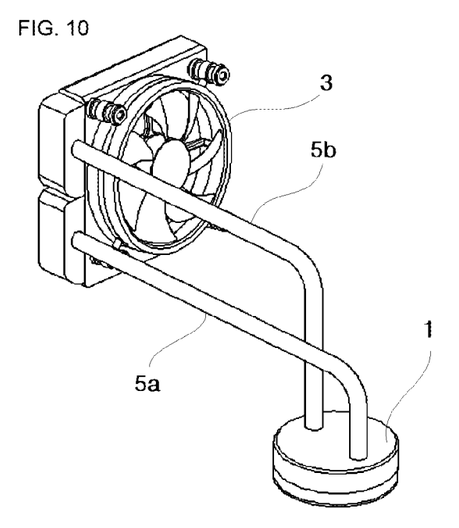
FIG. 10 is a view illustrating a system configuration of a water-cooling cooler for an electronic component in which the water pump of a water-cooling cooler for an electronic component according to the embodiment of the present disclosure is used.

FIG. 10 is a view illustrating a system configuration of a water-cooling cooler for an electronic component in which the water pump of a water-cooling cooler for an electronic component according to the embodiment of the present disclosure is used. As illustrated in FIG. 10, this system of the water-cooling cooler includes a condenser 3 consisting of a radiator and a fan. When cooling water is cooled through the condenser 3, the cold cooling water enters the water pump 1 through a pipe 5a so as to cool an electronic component (not shown) attached to the water pump 1 while being heated by heat transferred from the electronic component.

Afterwards, the heated cooling water is discharged from the water pump 1 to be retransferred to the condenser 3 through a pipe 5b. The water pump 1 may increase the flow rate and the velocity of a flow in the entire system, thereby causing rapid circulation of the cooling water. Accordingly, this may improve thermal exchange performance or heat exchange performance of not only the thermal exchange base 10 but also the condenser 3.

The water pump 1 may further include a controller (not shown) electrically connected to the drive unit to control the speeds of rotation of the inlet impeller 30 and the outlet impeller 40 in order to improve cooling efficiency. The controller may act to differently control the speeds of rotation of the inlet impeller 30 and the outlet impeller 40 to minimize the residual amount of cooling water, thereby minimizing a turbulence flow and improving heat exchange efficiency. The operation of the water pump 1 according to the present embodiment may increase the velocity of a flow and the flow rate within the chamber 50 or in the channel 110, thereby improving mass velocity (heat flux) and improving the Reynolds number and the Russell number.

Although the foregoing descriptions have been presented in conjunction with the accompanying drawings in order to explain certain principles of the present disclosure by way of example, it should be understood that a person having ordinary knowledge in the art to which the present disclosure relates could make various modifications and variations without departing from the essential features of the present disclosure. The foregoing embodiments disclosed herein shall be interpreted as being illustrative, while not being limitative, of the principle and scope of the present disclosure. It should be understood that the scope of the present disclosure shall be defined by the appended Claims, rather than by the foregoing detailed description, and all of their equivalents fall within the scope of the present disclosure.

The invention claimed is:

1. A water pump of a water-cooling cooler for an electronic component, the water pump comprising:
    a thermal exchange base located in a lower portion of the water pump, wherein a plurality of channels are provided on a top surface of the thermal exchange base such that cooling water flows through the plurality of channels to perform thermal exchange;
    a base cover located above the thermal exchange base to transversely block upper portions of the plurality of channels, wherein a first through-hole and a second through-hole vertically extend through the base cover to be spaced apart from each other at a predetermined distance and a first shaft-fixing portion and a second shaft-fixing portion are provided in central portions of the first through-hole and the second through-hole, respectively;
    an inlet impeller being rotatable about a first shaft vertically provided in the first shaft-fixing portion to push the cooling water to the top surface of the thermal exchange base;
    an outlet impeller being rotatable about a second shaft vertically provided in the second shaft-fixing portion to draw the cooling water from the top surface of the thermal exchange base;
    a chamber located above the thermal exchange base and including an inlet chamber that the cooling water enters, an outlet chamber that the cooling water exits, an inlet port communicating with the inlet chamber, and an outlet port communicating with the outlet chamber, such that the inlet impeller and the outlet impeller are accommodated in the inlet chamber and the outlet chamber, respectively; and
    a drive unit including a first motor stator located above the inlet chamber and a second motor stator located above the outlet chamber.

2. The water pump according to claim 1, wherein the base cover includes supports provided on inner circumferential portions of the first and second through-holes and connected to the first and second shaft-fixing portions, respectively.

3. The water pump according to claim 1, wherein the chamber is configured such that a portion between the inlet chamber and the outlet chamber adjoins the top surface of the base cover and the inlet chamber and the outlet chamber are isolated from each other, in positions above the plurality of channels.

4. The water pump according to claim 1, wherein the chamber includes a horizontal connector provided by horizontally expanding the inlet chamber and the outlet chamber, the horizontal connector being coupled to the thermal exchange base in a top-bottom direction in a sealing manner.

5. The water pump according to claim 1, further comprising a pump housing covering top portions of the chamber to accommodate the first and second motor stators therein.

6. The water pump according to claim 1, further comprising a controller electrically connected to the drive unit to control speeds of rotation of the inlet impeller and the outlet impeller.

* * * * *